United States Patent [19]

Miller et al.

[11] Patent Number: 4,682,404
[45] Date of Patent: Jul. 28, 1987

[54] MOSFET PROCESS USING IMPLANTATION THROUGH SILICON

[75] Inventors: Gayle W. Miller, Colorado Springs, Colo.; Nicholas J. Szluk, Albuquerque, N. Mex.; George Maheras; Werner A. Metz, Jr., both of Fort Collins, Colo.

[73] Assignee: NCR Corporation, Dayton, Ohio

[21] Appl. No.: 922,221

[22] Filed: Oct. 23, 1986

[51] Int. Cl.<sup>4</sup> .......................................... H01L 21/00
[52] U.S. Cl. .................................. 29/571; 29/576 B; 357/23.3
[58] Field of Search ............................ 29/571, 576 B; 357/23.3, 23.9, 59 K; 148/DIG. 124

[56] References Cited

U.S. PATENT DOCUMENTS

| | | | |
|---|---|---|---|
| 4,069,067 | 1/1978 | Ichinohe | 357/59 K |
| 4,149,904 | 4/1979 | Jones | 148/1.5 |
| 4,181,537 | 1/1980 | Ichinohe | 357/59 K |
| 4,182,023 | 1/1980 | Cohen et al. | 148/1.5 |
| 4,198,250 | 4/1980 | Jecmen | 148/1.5 |
| 4,306,915 | 12/1981 | Shiba | 357/59 K |
| 4,317,273 | 3/1982 | Guterman et al. | 29/571 |
| 4,330,931 | 5/1982 | Liu | 29/571 |
| 4,452,645 | 6/1984 | Chu et al. | 148/DIG. 124 |
| 4,536,944 | 8/1985 | Bracco et al. | 357/23.9 |
| 4,599,118 | 7/1986 | Han et al. | 148/1.5 |
| 4,629,520 | 12/1986 | Ueno et al. | 29/571 |

FOREIGN PATENT DOCUMENTS

| | | | |
|---|---|---|---|
| 2739662 | 3/1979 | Fed. Rep. of Germany | 357/23.3 |
| 0162873 | 12/1981 | Japan | 357/23.3 |
| 0056973 | 4/1982 | Japan | 29/571 |
| 0220971 | 12/1984 | Japan | 29/571 |
| 0245281 | 12/1985 | Japan | 29/571 |

OTHER PUBLICATIONS

Muramoto et al, "A New Self-Aligning Contact Process for MOS LSI", IEDM Technical Digest, 1978, pp. 185-188.
Ogura et al, "A Half Micron MOSFET Using Double Implanted LDD", IEDM Technical Digest, Paper 29.6, 1982, pp. 718-721.
Bartholomew et al, "Structure Using FET Selective Etching to Produce Small Dimensions", IBM Technical Disclosure Bulletin, vol. 23, No. 12, May 1981, pp. 5359-5361.
Ogura et al, "Design and Characteristics of the Lightly Doped Drain-Source (LDD) Insulated Gate Field Effect Transistor", IEEE Transactions on Electron Devices, vol. ED-27, No. 8, Aug. 1980, pp. 1359-1367.
Goto et al, "A New Self-Aligned Source/Drain Diffusion Technology from Selectively Oxidized Polysilicon", IEDM Technical Digest, Paper 25.3, 1979, pp. 585-588.

Primary Examiner—Brian E. Hearn
Assistant Examiner—M. Wilczewski
Attorney, Agent, or Firm—Wilbert Hawk, Jr.; Casimer K. Salys

[57] ABSTRACT

A simplified small geometry MOS process incorporates a tungsten shunt layer on the thin silicon gate electrode layer allowing reduction of the thickness of the silicon layer and the use of an implant through the layer to form precisely controlled shallow source/drain regions without channeling. Lightly doped extension of the source and drain regions are automatically formed by an LDD implant following an isotropic undercutting etch of the silicon. The process is readily adapted to optional guard band implants and other beneficial structures such as gate sidewall oxide spacers.

6 Claims, 8 Drawing Figures

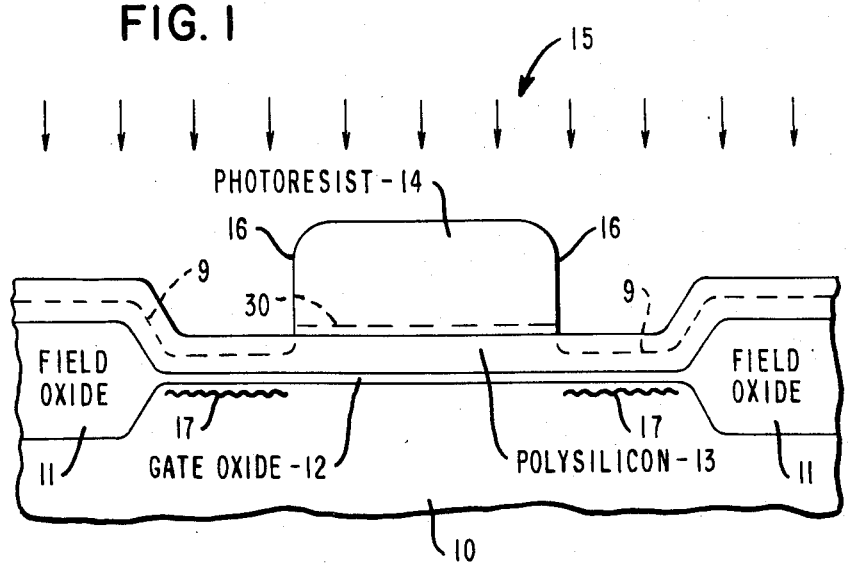
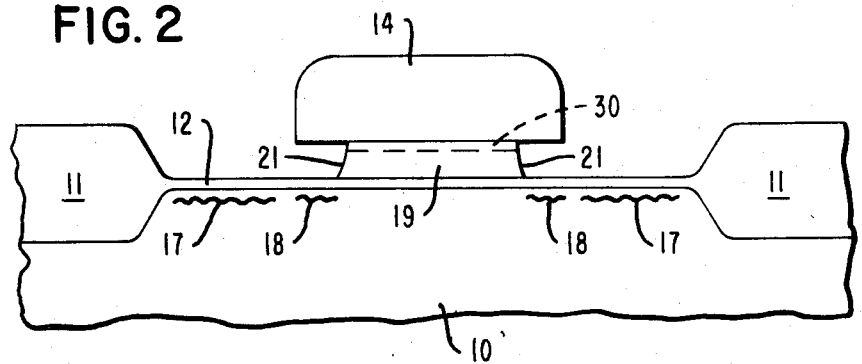
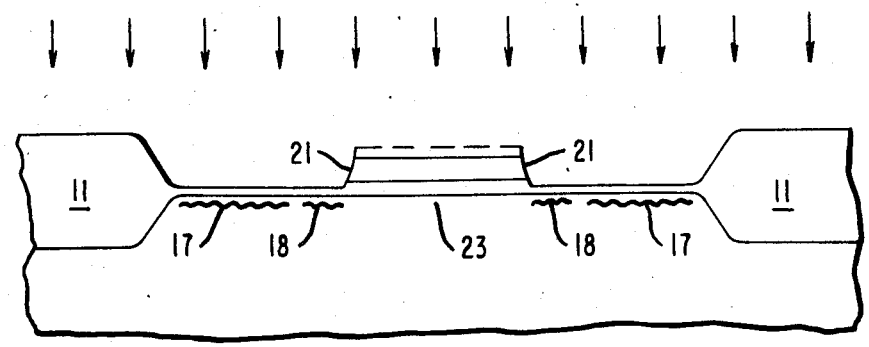

MOSFET PROCESS USING IMPLANTATION THROUGH SILICON

BACKGROUND OF THE INVENTION

The present invention relates to a method for forming self-aligned, small geometry, shallow junction depth MOS monolithic integrated circuits by implanting the $n^+/p^+$ source and drain regions through a silicon layer. The process sequence is also adaptable to the formation of beneficial structures, including LDD (lightly doped drain) structures, guard band structures and gate oxide sidewall spacers.

With the increasing implementation of small geometry, highly dense MOS monolithic integrated circuit components, various structural and operational problems have combined to limit device performance and manufacturing yields and, thus, the achievable minimum feature sizes and maximum densities. Among the most difficult of the problems are those collectively termed short-channel effects, which include hot carrier injection into the gate oxide and/or substrate, source-drain punch-through, reduced breakdown voltage and impact ionization. In hot carrier injection, for example, electrons are permanently injected into the gate oxide by the strong electric field which is created by the narrow channel region adjacent the drain and, as a consequence, alter the threshold voltage of the device. In addition to the short-channel effects, overlap between the gate electrode and the source and drain results in parasitic capacitance known as Miller capacitance, which decreases high frequency response and operational speeds.

As channel lengths and other device dimensions are reduced in VLSI monolithic integrated circuits, new device structures such as LDD structures, guard band structures, and gate sidewall dielectric spacers have been implemented to reduce the short-channel effects and to optimize transistor characteristics such as high transconductance, high breakdown voltage, fast operating speeds and device densities. In particular, the LDD structure is a shallow, preferably self-aligned $n^-$ or $p^-$ region formed between the MOSFET channel and the $n^+$ or $p^+$ source and drain diffusions. Except when bidirectional current is used, the LDD structure is needed only for the drain, not the source, but LDD structures are typically formed for both the source and the drain diffusions to avoid the use of an additional masking step. The LDD structure increases breakdown voltage and reduces impact ionization and hot electron emission by spreading the high electric field at the drain pinch-off region into the associated $n^-$ or $p^-$ region.

Several approaches are available for implementing LDD structures. One LDD approach is disclosed in Goto et al., "A New Self-Aligned Source/Drain Diffusion Technology From Selectively Oxidized Polysilicon", IEDM Technical Digest, Paper 25.3, 1979, pp. 585–588. Goto et al. discusses the "conventional process" of implanting source and drain regions through a precisely dimensioned polysilicon layer, and discloses an alternative approach for forming short channel, flat surface NMOS LSI's having self-aligned contacts and self-aligned source and drain diffusions using selective oxidation of a phosphorus-doped polysilicon layer. In the Goto et al. process, the field oxide and gate oxide are grown, contact cuts are made in the gate oxide, then a doped polysilicon layer is deposited and a nitride definition mask is defined and patterned. An oxidation step is then applied with the nitride in place to selectively and fully convert the polysilicon outside the nitride mask into an oxide interlayer which surrounds the gates, interconnects and contacts. In addition to the simultaneous conductor and interlayer formation, the oxidation drives-in the source, drain and contact regions. A relatively thin CVD oxide is then deposited to complete the dielectric interlayer, which provides self-aligned contacts for metallization. Alignment of the contact mask for the dielectric interlayer is not critical because only the CVD oxide is etched to form contact cuts and the cuts are not sufficiently deep to reach the $n^+$ regions.

Muramoto et al., "A New Self-Aligning Contact Process for MOS LSI", IEDM Technical Digest, 1978, pp. 185–188, is similar to Goto et al. in selectively converting the polysilicon gate/contact layer into an isolation oxide to define contact cuts in an intermediate dielectric layer. Initially, the field oxide and gate oxide are grown and contact cuts are opened in the gate oxide, then a doped polysilicon layer is deposited and a nitride definition mask is deposited and patterned over the gate substrate contact and interconnect areas. The poly is etched halfway through in the unmasked regions. Graded $n^+$ $n^-$ LDD source/drains are formed by a combination of ion implantation through the remaining polysilicon and gate oxide and by diffusion from the doped polysilicon. The nitride is then removed except at the gate, interconnect and contact areas and the poly is selectively oxidized with the nitride in place. In the unmasked, partially etched-through, thin poly regions, the poly is completely converted to oxide, whereas in the newly unmasked interconnect areas, partial conversion provides an insulative oxide layer formed over the poly conductors. Consequently, the oxidation and conversion completes the formation of poly gates interconnects and contacts which are surrounded by the oxide and, in the case of the interconnects, covered by the oxide interlayer. Also, the nitride prevents oxidation of the top surface of the poly and automatically defines contact "cuts" to the poly. The first nitride etch, the partial poly layer etch, and the nitride mask removal are done by plasma reactive sputter etching using $C_2F_6/C_2H_4/O_2$ gas system. With this system, double-layered nitride and polysilicon can be etched successively and nitride on poly or oxide can be selectively etched, by changing the gas mixture ratio.

Ogura et al., "Design and Characteristics of the Lightly Doped Drain-Source (LDD) Insulated Gate Field Effect Transistor", IEEE Transactions on Electron Devices, Vol. ED-27, No. 8, pp. 1359–1367, August 1980, describes LDD device design and characteristics and, in pertinent part, describes a conventional planar silicon gate processing technique for LDDFETS. After forming the field oxide and gate oxide, an oversized gate stack comprising the poly gate and an overlying oxide-nitride mask is formed and used as a mask during implanting of the $n^+$ source and drain through the gate oxide layer. A wet etch or plasma etch is then applied to undercut the gate to its final dimension, then the oxide-nitride mask is stripped and an $n^-$ implant is applied to form the LDD regions self-aligned with the channel and the $n^+$ source/drain diffusions.

Jecmen, U.S. Pat. No. 4,198,250, issued Apr. 15, 1980, applies a silicon dioxide gate overhang mask and uses the $n^+$ implant step to implant the $n^-$ LDD structure through the gate oxide layer. The oxide overhang mask is defined by wet chemical undercutting of the supporting doped polysilicon gate to the desired gate dimensions beneath the mask, then the n+ source/drain implant is applied. During the n+ implantation, the overhang mask partially blocks the ion so that the implant also forms shallow, lightly doped n− LDD regions self-aligned with the channel and the n+ source and drain regions.

Commonly assigned (to NCR Corporation) U.S. Pat. Nos. 4,182,023, issued Jan. 8, 1980, to Cohen et al., and 4,149,904 issued Apr. 17, 1979 to Jones, both use a photoresist overhang mask to precisely align the source and drain with the silicon gate and minimize gate overlap or Miller capacitance. In both patents, the gate is overetched/undercut a predetermined distance beneath a photoresist overhang mask. In the Cohen et al. the aligned source/drain structures are then formed by predeposition (by implantation or diffusion), followed by heating to drive the source/drain into coincidence with the gate boundaries. In the Jones the gate oxide layer is left intact and the source/drain are formed by ion implantation, using controlled lateral scattering during the implant to align the source/drain structures with the gate electrode.

As indicated by a review of the above-discussed articles and patents, the effectiveness of lightly doped source-drain structures in improving device performance and eliminating problems associated with small geometry high density monolithic integrated circuits is known. However, in implementing these beneficial structures, it is difficult to avoid process complexity. It is, accordingly, an object of the present invention to implement a MOS process which incorporates the characteristics of self-aligned lightly doped drain structures, yet is relatively simple and is adaptable to the incorporation of other beneficial structures.

It is also an object of the present invention to provide a simplified MOS process in which the n+/p+ source and drain are implanted through a silicon blocking layer covering the source/drain, to provide a shallow controlled implant which, in the case of boron in particular, is free of channeling effects.

It is another object of the present invention to provide a MOS process in which the lightly doped drain structure can be formed by lateral scattering of the implanted species by the silicon source/drain blocking layer.

It is also an object of the present invention to provide a MOS process which has the above advantages and which optionally incorporates a guard band diffusion into the drain (and source) structure with or without gate sidewall dielectric structures, in combination with the lightly doped drain structures, using a minimum of additional process steps, for the purpose of minimizing short-channel effects and Miller capacitance.

SUMMARY OF THE INVENTION

The MOS process which meets the above objectives is made possible by the use of a very thin layer of amorphous or polycrystalline silicon for the gate electrodes and conductors. This layer is nominally 150–200 nanometers thick. Very thin silicon conductors are possible because selectively deposited tungsten (or other selectively deposited metal or selectively formed silicide) is used as a shunt layer on the silicon. Thereby, the thin silicon gate electrode layer can also be used for interconnective purposes. In contrast to the masking and selective poly thinning etch and implant process mentioned in Muramoto et al., here the reduced silicon thickness makes feasible the use of a blanket n+/p+ source and drain implantation directly through the thin silicon layer. Furthermore, the presence of a thin silicon layer over the source/drain regions provides controlled, shallow implantation of boron or boron-bearing species and, thus, practically eliminates channeling. As a result, shallow source/drain implant regions can be created with minimum fabrication complexity.

A MOS process sequence which typically meets the above objectives involves initially depositing a phosphorous doped, possibly amorphous, silicon layer over the device active areas, then forming a photoresist mask over the silicon for the purpose of defining first boundaries which are, for MOSFET devices, the n+ (or p+) source and drain boundaries. This mask serves the dual function of masking for the gate definition and during the n+ (p+) implant. The next step is an n-type (p-type) implant of selected energy and dose for penetrating the silicon layer to form an n+ (p+) type doped regions implant in the surface-adjacent substrate region defined the first boundary. The silicon layer is then etched in the presence of the mask using an isotropic dry plasma or wet chemical etch technique to undercut the resist to form the silicon into a gate of selected lateral dimensions.

Next, the implant/definition mask is removed to expose the patterned gate electrode and the IC structure can be subjected to a relatively low energy, low dose optional implant to for the n− (p−) LDD structures self-aligned with, and between, the gate and the n+ (p+) source/drain regions. The crucial steps of this aspect of the process are completed by a thermal cycle which activates the implanted species, and drives-in the n+ or p+ regions to form the self-aligned, graded n+ n− or p+ p− LDDFET.

Those of skill in the art will appreciate that the anneal step can be tailored to accommodate subsequent high temperature processing steps so that the combination of such steps provides the desired anneal, activation and drive-in. In addition, as described in the Jecmen patent, the initial aligned LDD regions do not diffuse to the extent that the highly doped regions do, so that initial lightly doped drain alignment is preserved during the subsequent anneal and/or other high temperature processing.

Furthermore, the process is readily adaptable to the formation of other structures such as guard band structures, gate sidewall oxide spacers, and self-aligned contacts. For example, the guard bands can be formed by a subsequent, opposite conductivity, p− (n−) blanket implant following the LDD implant. In one preferred process sequence, the sidewall oxide spacers are formed after the anneal by depositing a layer of conformal CVD oxide on the structure, then applying an anisotropic dry oxide etch step to remove the oxide from horizontal surfaces. In one specific additional aspect, the LDD implant is formed by a low dose, low energy implant step and is followed by a higher dose, low energy opposite impurity type guard band implant.

BRIEF DESCRIPTION OF THE DRAWINGS

The above and other objectives and aspects of the present invention are described in detail with respect to the drawings, in which:

FIGS. 1–7 are schematic cross-sectional representation of an n-LDD MOSFET taken sequentially during the major processing steps illustrating the sequence for forming LDD structures (and optional guard band structures, sidewall oxide spacers and self-aligned contacts)

DETAILED DESCRIPTION OF THE INVENTION

Figure 4:
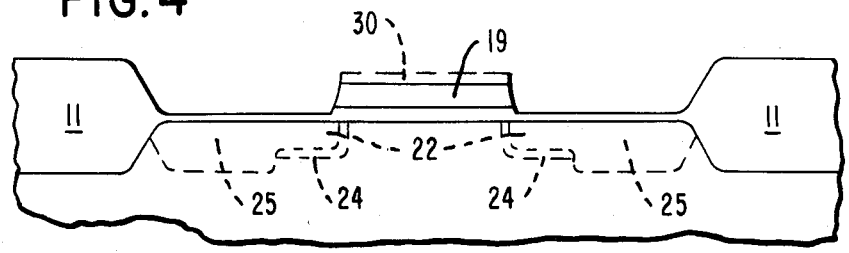

FIG. 1 is a schematic cross-sectional representation of the front-end processing stage of an NMOS integrated circuit, taken at the point of implementing the critical steps of the present invention. For simplicity, each of the four figures shows a single MOS active region 15 of a monolithic integrated circuit.

The starting structure typically comprises <100>, p-type or n-type (for n-channel or p-channel devices, respectively) single crystal silicon substrate 10 having a resistivity of about 1 to 20 ohm centimeters. Epitaxial material could also be used. At this stage in the front end processing, an isolation structure such as field oxide 11 has been formed in substrate 10, preferably partially or entirely recessed within the substrate, followed by the formation of a gate oxide 12 and field and channel implants (not shown). Typically, the field oxide 11 is about 600-850 nanometers thick and is formed by thermal oxidation of the silicon substrate. The gate oxide 12 can be about 25-75 nanometers thick and is also formed by oxidation of the silicon substrate.

Those of skill in the art will readily implement the steps necessary to provide the structure of FIG. 1 and will understand that these process parameters and dimensions, as well as those described below, are given by way of example only and can be varied to achieve the desired structure as well as modifications which are within the scope of the invention.

Next, and referring further to FIG. 1, a thin layer of typically phosphorous doped polycrystalline silicon or, possibly, doped amorphous silicon, 13 is deposited over the gate and field oxide structure to a nominal thickness of about 150-200 nanometers using an LPCVD process (low pressure chemical vapor deposition) and an $SiH_4$ gas system. Use of an amorphous silicon layer reduces occurrence of channeling of implanted ions and will result in a shallower distribution of deposit along in the source/drain areas, most importantly in the case of boron. An etchant- and implant-mask 14 is then formed above the gate electrode location. Specifically, the lateral dimensions of the mask are selected so that sides 16—16 thereof define the boundaries of the subsequently formed n+ or p+ source and drain regions. The mask 14 can be a photoresist layer which is deposited and delineated using conventional photolithographic techniques.

The desired thickness of the subsequently-patterned gate electrodes/conductors determines the as-deposited thickness of polysilicon layer 13. If the n+ or p+ source/drain implant through the silicon requires a different, smaller thickness, the poly is etched to the desired thickness outside the confines of mask 14. Preferably, a directional dry etch technique is used. One suitable process is reactive ion etching using a $C_2ClF_5/SF_6$ gas system. The resulting thickness, shown in phantom as layer 9, is determined by the particular implantation process and the desired source/drain doping profile. Normally, it is unnecessary.

Next, referring still further to FIG. 1, the structure is subjected to an n+ or p+ implant in the presence of the oversized photoresist mask 14 to deposit the source and drain regions. The chosen implant energy is sufficiently high so that the arsenic or phosphorous (or boron) ions penetrate the thin silicon layer 13 (or 9) and the gate oxide 12, and are embedded in substrate 10 at a shallow depth general designated as surface-adjacent region 17. The implant beam current is selected to provide a heavy doping level in the surface adjacent region 17. The inside boundaries of the n+ or p+ source/drain regions 17—17 are precisely aligned by the edges 16—16 of the photoresist mask 14.

For example, for a silicon layer 13 which is 200 nanometers thick, a boron implant energy of 80 keV and dose of 5E15-1E16 $cm^{-2}$ provides a p+ layer 17 of about $2 \times 10^{19}$ $cm^{-3}$ concentration at an initial junction depth of 40-60 nanometers. Similarly, for a 200 nanometers silicon layer 13, a phosphorous implant of 190 keV, and 5E15-1E16 $cm^{-2}$ provides approximately a $2 \times 10^{19}$ $cm^{-3}$ n+ layer 17 at an initial $x_j$ of about 50 nanometers.

Next, referring to FIG. 2, the silicon layer 13 is etched in the presence of the oversized mask 14 to remove the layer 13 outside the boundaries of the mask and continued to undercut the silicon a predetermined distance beneath the mask. An isotropic etch or a combination of anisotropic and isotropic processes may be used. One suitable process is a wet chemical etch using a diluted concentration of nitric acid, hydrofluoric acid and acetic acid in water. One suitable dry etch is reactive ion etching using an $SF_6$ gas system. Using these etching techniques, the photoresist 14 is preserved and provides precise pattern definition of the silicon, while the underlying oxide 12 serves as an etch barrier to protect the silicon substrate 10. As one example of dimensions, the oversized photoresist mask 14 is 1.5 micrometers wide and the plasma etch process is used to overetch/undercut the silicon layer 0.2-0.3 micrometers from each side to align each gate edge 21 with the inner edge of LDD regions 18. Alternatively, the silicon layer is overetched/undercut about 0.4 micrometers on each side of the mask 14 to provide a gate electrode 19 which is 0.7 micrometers wide, and which has resulting sides 21—21 which precisely locate the subsequent LDD implant relative to the channel between the n+ source/drain regions.

Referring to FIG. 3, the next step is to remove the photoresist mask 14, using any of several techniques such as an oxygen plasma ashing, a "piranha" wet chemical resist strip using concentrated sulfuric acid and hydrogen peroxide, or an ultrasonic acetone bath. The gate oxide layer 12 may then be lightly etched, as by applying buffered hydrofluoric wet acid etchant, for the purpose of controlling the thickness of the oxide layer, in the event the LDD implantation requires a lesser level of partial masking by the gate oxide layer.

Referring further to FIG. 3, the structure is then subjected to a low energy blanket implant (phosphorus 30 keV, or arsenic at 70 keV and 5E13 $cm^{-2}$; or boron at 20 keV and 5E13 $cm^{-2}$) to complete the formation of the n− or p− LDD impurity concentrations regions 18 self-aligned with the respective n+ or p+ source and drain impurity concentration regions 17, and a medial channel region 23 defined by the gate electrode boundaries 21—21.

As an option, a 5E13 $cm^{-2}$ dose, low energy (typically 50 keV for boron, 75 keV for phosphorous), opposite conductivity implant can be implemented to form p- or n- guard band structures 24 (see FIG. 4) about the respective n- or p- LDD regions 22 self-aligned with the respective n+ or p+ source/drain regions 25 and the gate electrodes 19, and to a deeper junction depth (following the anneal/drive-in) than the corresponding LDD regions 22.

Referring to FIG. 4, the structure in FIG. 3 is shown following an anneal cycle (for example, at 900 degrees C. for 0.5 hours in nitrogen) to anneal implant damage, activate the implanted species, drive-in all implants to a desired junction depth, and form silicon crystals in the gate electrode 19 layer if amorphous silicon was initially utilized. For the above-described exemplary conditions and parameters, the resulting n+ and p+ source/drain junction depths are in the range of 0.2–0.3 micrometers. As shown schematically in the figure, the resulting guard band layers 24 extend to a slightly greater depth than the LDD structures 22. As a result, the guard band structures keep the electric field lines from extending into the channels and thereby allow the use of higher electric fields and/or smaller device dimensions. In short, the guard bands enhance the action of the LDD structures in suppressing short channel effects, with little or no increase in gate overlap and the associated Miller capacitance.

Those of skill in the art will appreciate that the use of subsequent high temperature process steps can be used to supplement or replace the anneal step in providing the desired anneal, activation and drive-in functions.

Figure 5:
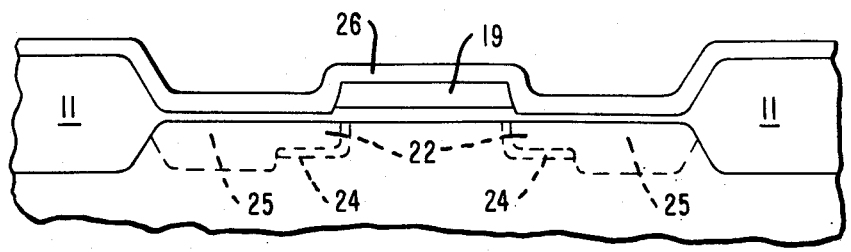
Figure 6:
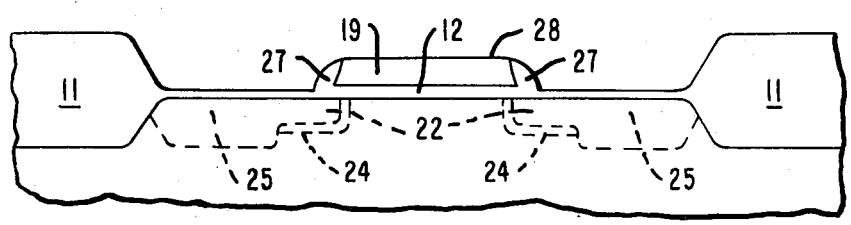

The process can also include the formation of sidewall dielectric structures. Referring to FIG. 5, in a preferred sequence of forming sidewall oxidation, a layer 26 of CVD silicon dioxide is conformally deposited on the structure of FIG. 4 (after the removal of mask 14, and after the LDD and guard band implants and the annealing step). A suitable CVD gas system is silane/oxygen at atmospheric or reduced pressure with or without RF plasma excitation. A typical thickness of layer 26 is about 80–100 nanometers. As shown in FIG. 6, the oxide layer 26 is then etched using directional techniques such as reactive ion etching and an etchant gas mixture of equal parts $C_2F_6$ (Freon 116) and $CHF_3$, to remove the oxide from horizontal surfaces and leave intact the 80–100 nanometer thick sidewall spacers 27—27. If the surfaces of areas defined by source/drain and LDD regions 22 and 25 are to remain masked by residuals of gate oxide 12, the end point of the etch will have to be responsive to the exposure of silicon gate electrode 19 surface, designated 28.

Figure 7:
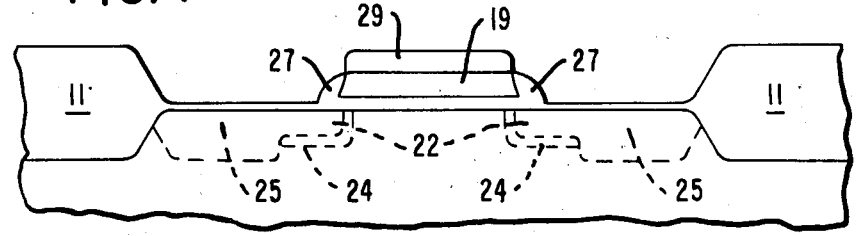

The next steps of the present invention are completed by selective deposition of a shunt layer 29, such as selectively deposited tungsten on surface 28 of the silicon electrode 19. See FIG. 7. Standard processing can then be employed to complete the monolithic FET integrated circuit, including forming contacts in the interlayer dielectric to the underlying conductors, and forming metallization contacting the conductors via the contact cuts, followed by passivation. If gate electrode or interconnect silicon resistance is not a serious concern, it may be possible to overlook the use of a metal or silicide shunting layer over the thin silicon layer.

Figure 8:
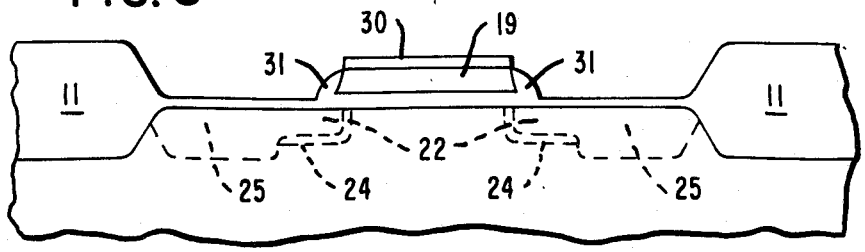
FIG. 8 depicts a pertinent process step of a different process sequence.

The process is also readily varied to incorporate sidewall thermal oxide spacers 31 rather than CVD spacers 27. Here, and as shown in phantom in FIG. 1, a silicon nitride masking layer 30 is formed on the polysilicon 13 beneath and congruent with the resist mask 14. Typically, the nitride mask is formed to a thickness of about 40 nanometers on the polysilicon by chemical vapor deposition, then is etched using the resist mask 14 as the etch mask. The process then proceeds the same as before through the FIG. 3 removal of the photoresist mask 14, the LDD implant and the optional guard band implant in FIG. 3. Referring to FIG. 8, prior to the implant anneal and activation, the structure is heated at a relatively low temperature (typically 850 degrees C.) in an oxidizing steam ambient. This selectively forms sidewall oxide spacers 31 approximately 200 nanometers thick on the sidewalls of gate electrode 19. In addition, the thermal oxidation step partially performs the implant anneal, that is, to partially drives-in and activates the implanted n+ and/or p+ regions. The structure after the thermal oxidation and subsequent anneal is shown in FIG. 8.

The steps of the present invention are then completed as described previously by selective deposition of a shunt layer 29 of tungsten on the silicon conductor 19. See generally FIG. 7. Standard processing can then be employed to complete the monolithic FET integrated circuit. Any high temperature processing steps subsequent to the sidewall thermal oxidation step and the anneal are used in combination with these two steps to establish the n+ or p+ junction depths.

As described, the present process normally eliminates an initial silicon etch step, provides controlled, shallow implantation through a thin silicon layer, and permits reduced device size due to the use of lightly doped drain structures which are formed by blanket implant of light dose. Both Miller capacitance and short-channel effects are reduced. In addition, the controlled implantation of boron or boron-bearing species using a thin silicon layer eliminates the need for very expensive high dose silicon amorphizing implant sequences, which use a high energy silicon ion pre-amorphizing step in conjunction with boron implantation and an anneal to provide high dose boron implants without channeling. As described, the present process is applicable to NMOS, PMOS, and with nominal extension to CMOS structures.

Having thus described a preferred and alternative embodiments of the present self-aligned LDD NMOS fabrication process, what is claimed is:

1. In a process for forming a MOS integrated circuit on a substrate having device active regions, the sequence comprising:
    forming a silicon layer which is approximately 150–200 nanometers thick over the device active regions;
    forming a mask over the silicon defining first edge boundaries of first source and drain regions;
    subjecting the structure to a relatively high energy implant dose for penetrating the silicon layer to form one of an n+ or a p+ implant in the surface-adjacent substrate region of the first source and drain region at the first edge boundary;
    etching the silicon layer in the presence of the mask to pattern the silicon to a gate electrode of selected lateral dimensions recessed a predetermined dimension beneath the first edge boundaries of the mask;
    removing the mask;
    subjecting the structure to a relatively low energy implant of the same conductivity type as the high energy implant to form lightly doped regions self-aligned with the first source and drain regions and the gate electrode; and
    applying a thermal cycle to activate the implanted species and drive-in the implanted species.

2. The process of claim 1, having the additional step of forming a conductive shunt layer on the silicon.

3. The process of claim 2, wherein following the low energy implant the structure is subjected to a second low energy opposite conductivity implant to form guard band doped regions about the lightly doped regions.

4. The process of claim 3, wherein after the thermal cycle a conformal layer of silicon dioxide is deposited on the structure and subjected to an anisotropic etch to remove horizontal sections of the layer and thereby provide gate sidewall oxide spacers.

5. In a process for forming a MOS integrated circuit on a substrate having device active regions, the sequence comprising:

forming a silicon layer which is approximately 150-200 nanometers thick over the device active regions;

forming a mask on the upper surface of the silicon comprising a layer of photoresist over a layer of silicon nitride to define first edge boundaries of source and drain regions;

subjecting the structure to a relatively high energy implant dose for penetrating the silicon layer to form one of an $n^+$ or a $p^+$ implant in the surface-adjacent substrate region of the first source and drain region at the first edge boundary;

etching the silicon layer in the presence of the mask to pattern the silicon to a gate electrode recessed a predetermined dimension beneath the first edge boundaries of the mask;

removing the photoresist portion of the mask;

subjecting the structure to a relatively low energy implant of the same conductivity type as the high energy implant to form lightly doped regions self-aligned with and between the source and drain regions and the gate electrode;

applying a thermal oxidation cycle to selectively oxidize the unmasked sidewalls of the silicon gate electrode but not the nitride-protected upper surface of the silicon;

removing the silicon nitride portion of the mask; and forming a conductive shunt layer on the silicon.

6. The process of claim 5, wherein following the low energy implant the structure is subjected to a second low energy opposite conductivity implant to form guard band regions about the lightly doped regions.

* * * * *